United States Patent
Xiao et al.

(10) Patent No.: US 12,336,234 B2
(45) Date of Patent: Jun. 17, 2025

(54) SUPER JUNCTION STRUCTURE AND METHOD FOR MANUFACTURING THE SAME

(71) Applicant: Shenzhen Sanrise-Tech Co., LTD, Guangdong (CN)

(72) Inventors: Shengan Xiao, Guangdong (CN); Dajie Zeng, Guangdong (CN)

(73) Assignee: Shenzhen Sanrise-Tech Co., LTD, Guangdong (CN)

( * ) Notice: Subject to any disclaimer, the term of this patent is extended or adjusted under 35 U.S.C. 154(b) by 662 days.

(21) Appl. No.: 17/579,743

(22) Filed: Jan. 20, 2022

(65) Prior Publication Data
US 2023/0006037 A1    Jan. 5, 2023

(30) Foreign Application Priority Data
Jul. 1, 2021  (CN) .............................. 202110742055

(51) Int. Cl.
*H10D 62/10* (2025.01)
*H01L 21/265* (2006.01)
(Continued)

(52) U.S. Cl.
CPC ...... *H10D 62/111* (2025.01); *H01L 21/26513* (2013.01); *H01L 21/266* (2013.01);
(Continued)

(58) Field of Classification Search
CPC ............. H01L 29/0634; H01L 29/0623; H01L 29/7802; H10D 30/66; H10D 62/107; H10D 62/111
See application file for complete search history.

(56) References Cited

U.S. PATENT DOCUMENTS

| | | | | |
|---|---|---|---|---|
| 8,546,882 | B2* | 10/2013 | Xiao | ................... H01L 29/0634 |
| | | | | 257/E21.409 |
| 8,653,586 | B2* | 2/2014 | Xiao | ................... H01L 29/0878 |
| | | | | 257/329 |

(Continued)

OTHER PUBLICATIONS

CN111341828 with machine translation (Year: 2020).*
CN111341830 with machine translation (Year: 2025).*

*Primary Examiner* — Britt D Hanley
*Assistant Examiner* — Victor V Barzykin
(74) *Attorney, Agent, or Firm* — Banner & Witcoff, Ltd.

(57) ABSTRACT

The present application discloses a super junction device, which includes: an N-type redundant epitaxial layer and an N-type buffer layer sequentially formed on an N-type semiconductor substrate; a trench filled super junction structure is formed on the N-type buffer layer; a back structure includes a drain region and a patterned back P-type impurity region; the N-type semiconductor substrate is removed in a back thinning process, and the N-type redundant epitaxial layer is completely or partially removed in the back thinning process; the resistivity of the N-type semiconductor substrate is 0.1-10 times the resistivity of a top epitaxial layer, the resistivity of the N-type redundant epitaxial layer is 0.1-10 times the resistivity of the N-type semiconductor substrate, and the resistivity of the N-type redundant epitaxial layer is lower than the resistivity of the N-type buffer layer. The present application further discloses a method for manufacturing a super junction device.

13 Claims, 5 Drawing Sheets

(51) Int. Cl.
  *H01L 21/266* (2006.01)
  *H01L 21/761* (2006.01)
  *H10D 30/01* (2025.01)
  *H10D 30/63* (2025.01)
  *H10D 30/66* (2025.01)
  *H10D 62/13* (2025.01)
  *H10D 62/17* (2025.01)

(52) U.S. Cl.
  CPC ......... *H01L 21/761* (2013.01); *H10D 30/025* (2025.01); *H10D 30/63* (2025.01); *H10D 30/66* (2025.01); *H10D 62/107* (2025.01); *H10D 62/124* (2025.01); *H10D 62/157* (2025.01); *H10D 62/393* (2025.01)

(56) References Cited

U.S. PATENT DOCUMENTS

| | | | |
|---|---|---|---|
| 10,217,813 B2* | 2/2019 | Hiyoshi | H01L 21/0262 |
| 10,615,254 B2* | 4/2020 | Mauder | H01L 29/4236 |
| 10,923,564 B2* | 2/2021 | Zhao | H01L 29/7813 |
| 11,201,236 B2* | 12/2021 | Fischer | H01L 29/0615 |
| 11,367,775 B1* | 6/2022 | Hell | H01L 29/7813 |
| 2016/0087032 A1* | 3/2016 | Hiyoshi | H01L 29/0634 257/77 |
| 2017/0345893 A1* | 11/2017 | Willmeroth | H01L 29/6609 |
| 2019/0088738 A1* | 3/2019 | Ono | H01L 29/0623 |
| 2019/0189800 A1* | 6/2019 | Orita | H01L 29/7827 |
| 2020/0006475 A1* | 1/2020 | Zhao | H01L 21/3065 |
| 2020/0335580 A1* | 10/2020 | Dun | H01L 29/1095 |
| 2022/0052154 A1* | 2/2022 | Weber | H01L 29/7811 |
| 2023/0006037 A1* | 1/2023 | Xiao | H01L 21/26513 |
| 2023/0307501 A1* | 9/2023 | Suzuki | H01L 29/0623 |

\* cited by examiner

SUPER JUNCTION STRUCTURE AND METHOD FOR MANUFACTURING THE SAME

CROSS-REFERENCE TO RELATED APPLICATIONS

This application claims the priority to Chinese patent application No. 202110742055.X, filed on Jul. 1, 2021, the disclosure of which is incorporated herein by reference in its entirety.

TECHNICAL FIELD

The present application relates to the field of semiconductor integrated circuit manufacturing, in particular to a super junction device. The present application further relates to a method for manufacturing a super junction device.

BACKGROUND

A super junction structure is a structure consisting of alternately arranged N-type pillars and P-type pillars, i.e., P-N pillars. If the super junction structure is used to replace the N-type drift region in the Vertical Double-diffused Metal-Oxide-Semiconductor (VDMOS) device, an on path is provided in an on state (only the N-type pillars provide the path, the P-type pillars do not provide), and reverse bias voltage is borne in an off state (the P-N pillars bear together), a super junction Metal-Oxide-Semiconductor Field-Effect Transistor (MOSFET) is formed. The super junction MOSFET can greatly reduce the on resistance of the device by using an epitaxial layer with low resistivity when the reverse breakdown voltage is consistent with that of the traditional VDMOS device.

By forming trenches in the N-type epitaxial layer and filling the P-type epitaxial layer in the trenches to form alternately arranged P-N pillars, it is a method capable of manufacturing super junctions in batches.

If it is necessary to manufacture devices with higher reverse bias breakdown voltage or devices with lower specific on resistance, the pitch of P-N pillars needs to be smaller, or the P-N depth of the devices needs to be increased. When using the process of trench filling P-type epitaxy, the above requirements will cause the following problems. Firstly, the height-width ratio of P-type trenches is too high, causing a problem to the etching of trenches. Especially after etching, the etching residue at the bottom of the trenches cannot be cleaned, resulting in device failure; Secondly, the height-width ratio of P-type trenches is too large, making the epitaxial filling of the devices more difficult, resulting in epitaxial holes or long epitaxial filling time, and thus increasing the manufacturing cost. Therefore, in these cases, one method is to divide the formation of P-type pillars into multiple times or twice, reduce the height-width ratio of P-type pillars each time, so that the etching, cleaning and filling process of trenches can be realized and has cost advantages.

In the existing technical solutions, high concentration is adopted (for example, a substrate with resistivity of 0.001-0.003 $\Omega \cdot cm$ and even lower resistivity is adopted to reduce Rdson), which is 2 orders of magnitude lower than the resistivity of 0.5-5 $\Omega \cdot cm$ of the N-type epitaxial layer deposited thereon. Therefore, in this process, the outdiffusion of substrate impurities will influence the uniformity of device performance. In order to reduce the outdiffusion, the high-concentration substrate needs to adopt back protection through an oxide film and a polysilicon film, which increases the cost. At the same time, since the wafer edge part of the high-concentration substrate (assuming that the back has been protected) is exposed in the process, special management shall be carried out in cleaning and other processes. For example, the high-concentration substrate is treated only before the liquid change of the cleaning solution, which reduces the production efficiency, or the liquid change is required to be carried out immediately after the high-concentration substrate is cleaned for other processes, which increases the cost.

In addition, as the P-N contact surface of the trench filled super junction MOSFET is completely smooth, unlike the super junction MOSFET formed through times of epitaxy, the part after the P-N pillars is formed through ion implantation after annealing diffusion, and the ion concentration distribution cannot be completely uniform. Therefore, there is always local charge imbalance at the P-N contact interface. The local charge imbalance improves the reverse recovery softness of the body diode. Therefore, the softness of the body diode of the existing trench filled super junction MOSFET is not as good as that of the device formed through times of epitaxy.

BRIEF SUMMARY

The technical problem to be solved by the present application is to provide a super junction device, which can eliminate the adverse effect of impurity outdiffusion of the high-concentration substrate, so that the super junction structure can realize an ultra-low specific-on-resistance structure, ensure good ohmic contact on the back, and improve the characteristics of the body diode of the device. For this purpose, the present application further provides a method for manufacturing a super junction structure.

In order to solve the technical problem, the super junction device provided by the present application includes:
  an N-type redundant epitaxial layer and an N-type buffer layer sequentially formed on an N-type semiconductor substrate;
  a super junction structure is formed on the N-type buffer layer, the super junction structure is formed by alternately arranging P-type pillars and N-type pillars, the P-type pillars consist of a P-type semiconductor layer filled in trenches, the trenches are formed in a top epitaxial layer, and the N-type pillars consist of the top epitaxial layer filled between the P-type pillars;
  a back structure of the super junction device includes a drain region and a patterned back P-type impurity region;
  the drain region is formed through full plane back N-type ion implantation after a back thinning process;
  the back P-type impurity region is selected through a photolithography process, and the back P-type impurity region includes P-type impurities formed through back P-type ion implantation in selected regions;
  the implantation peak position of the back P-type ion implantation is greater than the implantation peak position of the back N-type ion implantation; there is spacing between the back P-type impurity region and bottom surfaces of the P-type pillars;
  the N-type semiconductor substrate is removed in the back thinning process, the N-type redundant epitaxial layer is completely or partially removed in the back thinning process, and the thickness of the N-type buffer layer is completely remained after the back thinning process;

the resistivity of the N-type semiconductor substrate is 0.1-10 times the resistivity of the top epitaxial layer to ensure that the outdiffusion of doped impurities in the N-type semiconductor substrate does not influence the performance of the super junction structure;

the resistivity of the N-type redundant epitaxial layer is 0.1-10 times the resistivity of the N-type semiconductor substrate, the resistivity of the N-type redundant epitaxial layer is lower than the resistivity of the N-type buffer layer, and the N-type redundant epitaxial layer is used to ensure that the back thinning process is capable of completely removing the N-type semiconductor substrate without influencing the N-type buffer layer and to ensure that the drain region is capable of reaching required doping concentration.

As a further improvement, the resistivity of the N-type buffer layer is 0.5-2 times the resistivity of the top epitaxial layer.

As a further improvement, the resistivity of the N-type buffer layer is equal to the resistivity of the top epitaxial layer.

As a further improvement, the resistivity of the N-type redundant epitaxial layer is less than 0.2 times the resistivity of the top epitaxial layer.

As a further improvement, the resistivity of the N-type redundant epitaxial layer is 0.1 times the resistivity of the top epitaxial layer.

As a further improvement, the impurity of the back N-type ion implantation includes phosphorus or arsenic, and the implantation dose is $5E12\ cm^{-2}$-$1E15\ cm^{-2}$;

the impurity of the back P-type ion implantation includes B or BF2, the implantation dose is $1E11\ cm^{-2}$-$5E12\ cm^{-2}$, and the implantation energy is 50 keV-400 keV.

As a further improvement, the size of at least one direction of each selected region of the back P-type impurity region is greater than or equal to 5 microns; the thickness of photoresist in the photolithography process is greater than or equal to 4 microns.

As a further improvement, the back P-type impurity region is of P-type net doping, and the maximum concentration of P-type net doping in the back P-type impurity region is less than or equal to the minimum concentration of the P-type pillars.

As a further improvement, the back P-type impurity region is of P-type net doping, and the maximum concentration of P-type net doping in the back P-type impurity region is less than or equal to $\frac{1}{2}$ of the minimum concentration of the P-type pillars.

As a further improvement, the back P-type impurity region is of N-type net doping, and the concentration of N-type net doping in the back P-type impurity region is $\frac{1}{5}$-$\frac{1}{100}$ of the concentration of N-type impurities when P-type impurities are not implanted.

As a further improvement, the drain region and the back P-type impurity region are subject to laser annealing, and the depth range of the back P-type impurity region is less than or equal to the depth of the laser annealing.

As a further improvement, the area of the back P-type impurity region is 5%-30% of the area of the whole drain region.

As a further improvement, the super junction structure is formed by superposing a plurality of layers of super junction substructures, each layer of the super junction substructures is formed by alternately arranging P-type sub-pillars and N-type sub-pillars of the corresponding layer, all layers of the P-type sub-pillars are longitudinally superposed to form the P-type pillars, and all layers of the N-type sub-pillars are longitudinally superposed to form the N-type pillars;

the number of layers of the super junction substructures in the super junction structure is two or more than three;

the opening width of each P-type sub-pillar is equal to the opening width of the N-type sub-pillar of the same layer;

or the opening width of each P-type sub-pillar is not equal to the opening width of the N-type sub-pillar of the same layer;

a charge balance structure in each layer of the super junction substructures is configured so that the deviation of the total amount of impurities in the P-type sub-pillars and the N-type sub-pillars is less than 5% of the total amount of impurities in any one of the P-type sub-pillars and the N-type sub-pillars;

the thickness of each layer of the N-type sub-pillars above a second layer is configured so that N-type top epitaxial sub-layers corresponding to the N-type sub-pillars are capable of identifying alignment marks and overlay accuracy marks at the bottom after deposition.

As a further improvement, a first layer of super junction substructures is located at the bottom and a second layer of super junction substructures is superposed on the first layer of super junction substructures;

in the second layer of super junction substructures, the top opening width of a second layer of P-type sub-pillars is greater than the bottom opening width, and the best charge balance is realized at the bottom of the second layer of P-type sub-pillars between the second layer of P-type sub-pillars and the second layer of N-type sub-pillars; in the first layer of super junction substructures, the top opening width of the first layer of P-type sub-pillars is greater than the bottom opening width, and the best charge balance is realized at the top of the first layer of P-type sub-pillars between the first layer of P-type sub-pillars and the first layer of N-type sub-pillars;

or the trenches of the first layer of P-type sub-pillars of the first layer of super junction substructures are inclined trenches, and the trenches of the second layer of P-type sub-pillars of the second layer of super junction substructures are vertical trenches; the depth of the first layer of P-type sub-pillars is more than 10 microns greater than the depth of the second layer of P-type sub-pillars; in the second layer of super junction substructures, charge balance is realized at each longitudinal position between the second layer of P-type sub-pillars and the second layer of N-type sub-pillars;

or the trenches of the first layer of P-type sub-pillars of the first layer of super junction substructures are vertical trenches, and the trenches of the second layer of P-type sub-pillars of the second layer of super junction substructures are inclined trenches; the depth of the first layer of P-type sub-pillars is more than 10 microns greater than the depth of the second layer of P-type sub-pillars; in the first layer of super junction substructures, charge balance is realized at each longitudinal position between the first layer of P-type sub-pillars and the first layer of N-type sub-pillars.

In order to solve the technical problem, the method for manufacturing the super junction structure provided by the present application includes the following steps:

step 1: sequentially forming an N-type redundant epitaxial layer and an N-type buffer layer on an N-type semiconductor substrate, wherein the resistivity of the N-type semiconductor substrate is 0.1-10 times the resistivity of a subsequent top epitaxial layer to ensure that the outdiffusion of doped impurities in the N-type semiconductor substrate does not influence the performance of the super junction structure;
the resistivity of the N-type redundant epitaxial layer is 0.1-10 times the resistivity of the N-type semiconductor substrate, and the resistivity of the N-type redundant epitaxial layer is lower than the resistivity of the N-type buffer layer;

step 2: forming a super junction structure on a surface of the N-type buffer layer through a trench filling process, wherein the super junction structure is formed by alternately arranging P-type pillars and N-type pillars, the P-type pillars consist of a P-type semiconductor layer filled in trenches, the trenches are formed in a top epitaxial layer, and the N-type pillars consist of the top epitaxial layer filled between the P-type pillars;

step 3: completing a front process and then performing the following back process:

step 31: performing a back thinning process, wherein the N-type semiconductor substrate is removed in the back thinning process, the N-type redundant epitaxial layer is completely or partially removed in the back thinning process, and the thickness of the N-type buffer layer is completely remained after the back thinning process;

in the back thinning process, the N-type redundant epitaxial layer is used to ensure that the back thinning process is capable of completely removing the N-type semiconductor substrate without influencing the N-type buffer layer;

step 32: forming a back photoresist pattern opening a back P-type impurity region by adopting a photolithography process, and then performing back P-type ion implantation to implant P-type impurities in selected regions and form the back P-type impurity region, wherein the implantation peak position of the back P-type ion implantation is greater than the implantation peak position of the back N-type ion implantation; there is spacing between the back P-type impurity region and bottom surfaces of the P-type pillars;

step 33: performing back N-type ion implantation to form a drain region, wherein the N-type redundant epitaxial layer further ensures that the drain region is capable of reaching required doping concentration.

As a further improvement, the resistivity of the N-type buffer layer is 0.5-2 times the resistivity of the top epitaxial layer;
the resistivity of the N-type redundant epitaxial layer is less than 0.2 times the resistivity of the top epitaxial layer.

As a further improvement, the size of at least one direction of each selected region of the back P-type impurity region is greater than or equal to 5 microns; the thickness of photoresist in the photolithography process is greater than or equal to 4 microns.

As a further improvement, the back P-type impurity region is of P-type net doping, and the maximum concentration of P-type net doping in the back P-type impurity region is less than or equal to the minimum concentration of the P-type pillars;
or the back P-type impurity region is of N-type net doping, and the concentration of N-type net doping in the back P-type impurity region is 1/5-1/100 of the concentration of N-type impurities when P-type impurities are not implanted.

As a further improvement, the drain region and the back P-type impurity region are subject to laser annealing, and the depth range of the back P-type impurity region is less than or equal to the depth of the laser annealing.

As a further improvement, the area of the back P-type impurity region is 5%-30% of the area of the whole drain region.

The present application specially configures the impurity concentration relationship between the N-type semiconductor substrate and the top epitaxial layer corresponding to the super junction structure. Such configuration can ensure that the N-type semiconductor substrate will not form the impurity outdiffusion that will influence the doping distribution of the super junction structure. Therefore, the present application can eliminate the adverse effect of the impurity outdiffusion of the high-concentration substrate on the super junction structure, making the super junction structure capable of realizing an ultra-low specific-on-resistance structure, for example, making the pitch of the P-N pillars of the super junction structure smaller and the depth greater, thus reducing the specific on resistance of the device.

Since the present application does not reduce the specific on resistance of the device by increasing the doping concentration of the N-type semiconductor substrate, the N-type semiconductor substrate will be completely removed in the back thinning process to eliminate the adverse effect of the N-type semiconductor substrate on the specific on resistance of the device.

In order to completely remove the N-type semiconductor substrate without influencing the N-type buffer layer, an N-type redundant epitaxial layer is additionally disposed in the present application. The N-type redundant epitaxial layer can increase the process window of the back thinning process, so that the N-type semiconductor substrate can be completely removed without influencing the N-type buffer layer.

The present application further configures the doping concentration relationships between the N-type redundant epitaxial layer and the N-type semiconductor substrate, and between the N-type redundant epitaxial layer and the N-type buffer layer, that is, it can avoid the adverse effect caused by the excessive doping concentration of the N-type redundant epitaxial layer, for example, the fluctuation in the resistivity of the epitaxial layer in a transition region. At the same time, it can also form a drain region with high doping concentration in combination with back N-type ion implantation, form a good ohmic contact with the back metal layer, reduce the ratio of back contact resistance to the whole on resistance to less than 1%.

Since the present application does not need to use a high-concentration N-type semiconductor substrate, it can perform a photolithography process to local P-type impurity implantation on the back, that is, form the back P-type impurity region, thus changing the carrier distribution of the device when the body diode is on, especially increasing the carriers from the P-N pillars, that is, the super junction structure to the drain region. Since these carriers are not in the P-N pillars, in the reverse recovery process, the carriers are not depleted when the P-N pillars experience depletion and complete depletion, and are pulled away with the further increase of Vds, finally increasing the reverse recovery time and thus improving the reverse recovery softness of the body diode. Therefore, the present application improves the characteristics of the body diode of the device, including the reverse recovery peak current (Irrm) and the reverse recovery softness.

BRIEF DESCRIPTION OF THE DRAWINGS

The present application will be further described below in detail with reference to the drawings and in combination with the specific embodiments.

DETAILED DESCRIPTION OF THE DISCLOSURE

Figure 1:
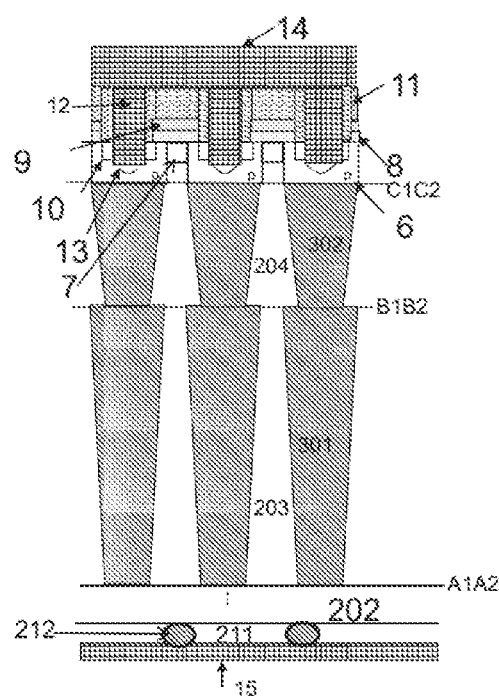
FIG. 1 illustrates a schematic diagram of a structure of a super junction device according to an embodiment of the present application.
Figure 2:
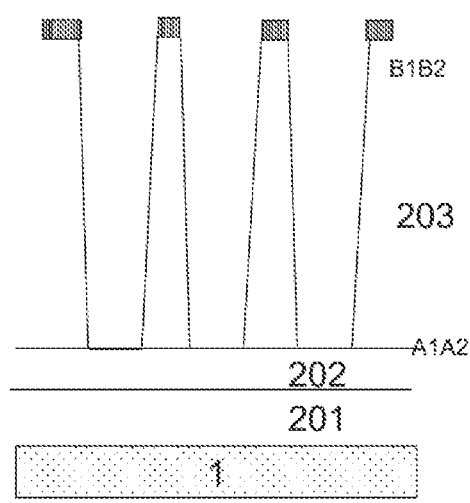
FIG. 2 to FIG. 9 illustrate schematic diagrams of device structures in steps of a method for manufacturing a super junction device according to an embodiment of the present application.
Figure 3:
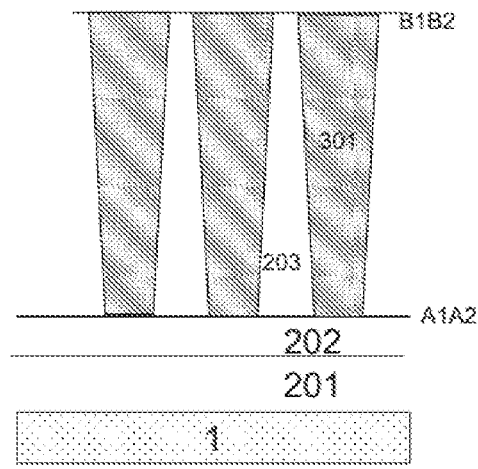

Referring to FIG. 1, it illustrates a schematic diagram of a structure of a super junction device according to an embodiment of the present application. The super junction device according to this embodiment of the present application includes:

an N-type redundant epitaxial layer 201 (refer to FIG. 2) and an N-type buffer layer 202 sequentially formed on an N-type semiconductor substrate 1 (refer to FIG. 2).

A super junction structure is formed on the N-type buffer layer 202, the super junction structure is formed by alternately arranging P-type pillars and N-type pillars, the P-type pillars consist of a P-type semiconductor layer filled in trenches, the trenches are formed in a top epitaxial layer, and the N-type pillars consist of the top epitaxial layer filled between the P-type pillars.

A back structure of the super junction device includes a drain region 211 and a patterned back P-type impurity region 212.

The drain region 211 is formed through full plane back N-type ion implantation after a back thinning process.

The back P-type impurity region 212 is selected by a photoresist 213 pattern formed through a photolithography process, and the back P-type impurity region 212 includes P-type impurities formed through back P-type ion implantation in selected regions.

The implantation peak position of the back P-type ion implantation is greater than the implantation peak position of the back N-type ion implantation; there is spacing between the back P-type impurity region 212 and bottom surfaces of the P-type pillars.

The N-type semiconductor substrate 1 is removed in the back thinning process.

The N-type redundant epitaxial layer 201 is completely or partially removed in the back thinning process. In other embodiments, the N-type redundant epitaxial layer 201 may also be completely removed in the back thinning process.

The thickness of the N-type buffer layer 202 is completely remained after the back thinning process.

The resistivity of the N-type semiconductor substrate 1 is 0.1-10 times the resistivity of the top epitaxial layer to ensure that the outdiffusion of doped impurities in the N-type semiconductor substrate does not influence the performance of the super junction structure.

The resistivity of the N-type redundant epitaxial layer 201 is 0.1-10 times the resistivity of the N-type semiconductor substrate 1, the resistivity of the N-type redundant epitaxial layer 201 is lower than the resistivity of the N-type buffer layer 202, and the N-type redundant epitaxial layer 201 is used to ensure that the back thinning process is capable of completely removing the N-type semiconductor substrate 1 without influencing the N-type buffer layer 202 and to ensure that the drain region 211 is capable of reaching required doping concentration.

The resistivity of the N-type buffer layer 202 is 0.5-2 times the resistivity of the top epitaxial layer. In some embodiments, the resistivity of the N-type buffer layer 202 is equal to the resistivity of the top epitaxial layer.

The resistivity of the N-type redundant epitaxial layer 201 is less than 0.2 times the resistivity of the top epitaxial layer. In some embodiments, the resistivity of the N-type redundant epitaxial layer 201 is 0.1 times the resistivity of the top epitaxial layer.

The impurity of the back N-type ion implantation includes phosphorus or arsenic, and the implantation dose is 5E12 $cm^{-2}$-1E15 $cm^{-2}$.

The impurity of the back P-type ion implantation includes B or BF2, the implantation dose is 1E11 $cm^{-2}$-5E12 $cm^{-2}$, and the implantation energy is 50 keV-400 keV.

The size of at least one direction of each selected region of the back P-type impurity region 212 is greater than or equal to 5 microns; the thickness of photoresist 213 in the photolithography process is greater than or equal to 4 microns.

The back P-type impurity region 212 is of P-type net doping, and the maximum concentration of P-type net doping in the back P-type impurity region 212 is less than or equal to the minimum concentration of the P-type pillars. In some embodiments, the back P-type impurity region 212 is of P-type net doping, and the maximum concentration of P-type net doping in the back P-type impurity region 212 is less than or equal to ½ of the minimum concentration of the P-type pillars.

Alternatively, the back P-type impurity region 212 is of N-type net doping, and the concentration of N-type net doping in the back P-type impurity region 212 is ⅕-1/100 of the concentration of N-type impurities when P-type impurities are not implanted.

The drain region 211 and the back P-type impurity region 212 are subject to laser annealing, and the depth range of the back P-type impurity region 212 is less than or equal to the depth of the laser annealing. For example, when the depth of the laser annealing is 4 microns, the depth of the back P-type impurity region 212 is less than 4 microns.

The area of the back P-type impurity region 212 is 5%-30% of the area of the whole drain region 211.

The super junction structure is formed by superposing a plurality of layers of super junction substructures, each layer of the super junction substructures is formed by alternately arranging P-type sub-pillars and N-type sub-pillars of the corresponding layer, all layers of the P-type sub-pillars are longitudinally superposed to form the P-type pillars, and all layers of the N-type sub-pillars are longitudinally superposed to form the N-type pillars.

In this embodiment of the present application, the number of layers of the super junction substructures in the super junction structure is two. In other embodiments, the number of layers of the super junction substructures in the super junction structure may also be more than three layers.

In FIG. 1, between line A1A2 and line B1B2 is a first layer of super junction substructures, which is formed by alternately arranging a first layer of P-type sub-pillars 301 and a first layer of N-type sub-pillars 203; between line B1B2 and line C1C2 is a second layer of super junction substructures, which is formed by alternately arranging a second layer of P-type sub-pillars 302 and a second layer of N-type sub-pillars 204.

The opening width of each P-type sub-pillar is greater than the opening width of the N-type sub-pillar of the same layer. For example, for a super junction structure with a pitch of 9 microns, it may be set that the top width of each P-type sub-pillar is 5 microns and the top width of each N-type sub-pillar is 4 microns. For a super junction structure with a pitch of 5 microns, it may be set that the top width of each P-type sub-pillar is 3 microns and the top width of each N-type sub-pillar is 2 microns.

A charge balance structure in each layer of the super junction substructures is configured so that the deviation of the total amount of impurities in the P-type sub-pillars and the N-type sub-pillars is less than 5% of the total amount of impurities in any one of the P-type sub-pillars and the N-type sub-pillars.

The thickness of each layer of the N-type sub-pillars above a second layer is configured so that N-type top epitaxial sub-layers corresponding to the N-type sub-pillars are capable of identifying alignment marks and overlay accuracy marks at the bottom after deposition. For example, the thickness of each layer above the second layer is configured to 20-25 microns.

A first layer of super junction substructures is located at the bottom and a second layer of super junction substructures is superposed on the first layer of super junction substructures.

In this embodiment of the present application, in the second layer of super junction substructures, the top opening width of a second layer of P-type sub-pillars 302 is greater than the bottom opening width, and the best charge balance is realized at the bottom of the second layer of P-type sub-pillars 302 between the second layer of P-type sub-pillars 302 and the second layer of N-type sub-pillars 204.

In the first layer of super junction substructures, the top opening width of the first layer of P-type sub-pillars 301 is greater than the bottom opening width, and the best charge balance is realized at the top of the first layer of P-type sub-pillars 301 between the first layer of P-type sub-pillars 301 and the first layer of N-type sub-pillars 203.

In this way, the best charge balance of the super junction structure is located at line B1B2, which has the following beneficial effects:

The P-type impurities in the upper part of the second layer of P-type sub-pillars 302 are more than the N-type impurities, and the N-type impurities in the lower part of the first layer of P-type sub-pillars 301 are more than the P-type impurities. When the device works, when Vds increases and the P-N pillars are broken down, the breakdown will occur around the top of the first layer of P-type sub-pillars 301, that is, the bottom of the second layer of P-type sub-pillars 302, so that the consistency of the current surge resistance, such as EAS, especially the current surge resistance of the device, is improved.

Through such setting, when the impurity concentration of the P-type pillars caused by the process deviates, the highest value of the electric field intensity in the whole P-type pillars is located around the center of the first layer of P-type sub-pillars 301, which has certain stability. When avalanche breakdown occurs at this position, holes (with positive charges) in generated electron-hole pairs flow to the upper part of the first layer of P-type sub-pillars 301 under the effect of the vertical electric field, thus better improving the charge balance in an upper region (in this region, P is more than N, and negative charges in the depleted P-type pillars are more than positive charges in the N-type pillars; therefore, the increase of positive charges improves the charge balance); electrons (with negative charges) in the generated electron-hole pairs flow to the bottom of the first layer of P-type sub-pillars 301 under the effect of the vertical electric field, thus better improving the charge balance in the first layer of P-type sub-pillars 301 (in this region, P is less than N, and the negative charges in the depleted P-type sub-pillars are less than the positive charges in the N-type sub-pillars; therefore, the increase of negative charges improves the charge balance). In this way, the breakdown voltage of the device is improved and the avalanche tolerance of the device is improved.

In other embodiments, the trenches of the first layer of P-type sub-pillars 301 of the first layer of super junction substructures are inclined trenches, and the trenches of the second layer of P-type sub-pillars 302 of the second layer of super junction substructures are vertical trenches; the depth of the first layer of P-type sub-pillars 301 is more than 10 microns greater than the depth of the second layer of P-type sub-pillars 302. In the second layer of super junction substructures, charge balance is realized at each longitudinal position between the second layer of P-type sub-pillars 302 and the second layer of N-type sub-pillars 204. The charge balance is that the deviation of the total amount of impurities in the second layer of P-type sub-pillars 302 and the second layer of N-type sub-pillars 204 is less than 5% of the total amount of impurities in any one of the second layer of P-type sub-pillars 302 and the second layer of N-type sub-pillars 204. In this way, higher breakdown voltage can be obtained.

Alternatively, the trenches of the first layer of P-type sub-pillars 301 of the first layer of super junction substructures are vertical trenches, and the depth of the first layer of P-type sub-pillars 301 is more than 10 microns greater than the depth of the second layer of P-type sub-pillars 302. In the first layer of super junction substructures, charge balance is realized at each longitudinal position between the first layer of P-type sub-pillars 301 and the first layer of N-type sub-pillars 203. The charge balance is that the deviation of the total amount of impurities in the first layer of P-type sub-pillars 301 and the first layer of N-type sub-pillars 203 is less than 5% of the total amount of impurities in any one of the first layer of P-type sub-pillars 301 and the first layer of N-type sub-pillars 203. The trenches of the second layer of P-type sub-pillars 302 of the second layer of super junction substructures are inclined trenches. In this way, the overall P-N pillar depth is increased and the breakdown voltage of the device is improved.

A front structure of the super junction device is further formed on the super junction structure. The super junction device is a super junction NMOS. The front structure includes a plurality of super junction device unit structures. Each super junction device unit structure includes:

a P-type well 6 formed in the top of each P-type pillar. The P-type well 6 further extends into the N-type pillars on the two sides.

A gate structure formed by superposing a gate dielectric layer such as a gate oxide layer 8 and a polysilicon gate 9 is formed at the top of the P-type well 6. In FIG. 1, the gate oxide layers 8 and the polysilicon gates 9 at the tops of the two adjacent P-type wells 6 on the two sides of the N-type pillar are connected together to form an integral structure.

A source region 10 is formed in the surface region of the P-type wells 6 on the two sides of the polysilicon gates 9.

An interlayer film 11 covers a region between the top of the polysilicon gate 9 and the polysilicon gate 9.

A contact 12 passes through the interlayer film 11. The contact 12 in FIG. 1 is a contact located in the top of the source region 10, and a contact P-type implantation contact region 13 is formed at the bottom of the contact 12 in the top of the source region 10.

A front metal layer 14 is patterned to form a source and a gate. FIG. 1 illustrates the source formed by the front metal layer 14.

Generally, in order to further reduce the on resistance, a JFET implantation region 7 formed through ion implantation is further formed in the surface region of the N-type pillar between the P-type wells 6.

A drain formed by a back metal layer 15 is formed in the drain region 211.

This embodiment of the present application adopts the P-N width and concentration matching structure of the P-N pillars of the stacked charge balance layer of the substrate with specially set concentration, that is, the resistivity, the P-N pillars of the stacked charge balance layer are the super junction structure formed by superposing a plurality of super junction substructures, and the P-N width is the width of the adjacent P-type pillar and N-type pillar, which solve the problem of outdiffusion of impurities in the high-concentration substrate. Especially when combined with the stacked charge balance structure with ultra-low specific on resistance, a redundant epitaxial layer 201 with high concentration is added between the substrate and the buffer layer 202 of the P-N pillars to ensure that the substrate with set resistivity is completely removed in the final back grinding, leaving part of the redundant epitaxial layer 201 as the bottom part of the device. In addition, back N-type ion implantation is performed to ensure good ohmic contact between the back N+ region and the back metal of the device. In this way, the outdiffusion problem caused by the high-concentration substrate is solved, and the on resistance of the device is basically not influenced by the back grinding process.

In this embodiment of the present application, the resistivity of the substrate 1 is set within 0.1-10 times the resistivity of the N epitaxial layers 203 and 204 of the P-N pillars deposited thereon. Moreover, the difference in resistivity between the substrate 1 and other epitaxial layers thereon, such as epitaxial layers 201 and 202, is required to not exceed one order of magnitude. In this way, it is ensured that the outdiffusion of impurities in the high-concentration substrate 1 will not influence the device performance in the working process of the device, and it will not increase the difficulty of the fluctuation process of resistivity in the transition region during deposition of the epitaxial layer 201 or 202 since the impurity concentration of the epitaxial layer 201 or 202 is much higher than the impurity concentration of the substrate 1.

In this embodiment of the present application, the substrate concentration of the N-type semiconductor substrate 1 is not limited theoretically, that is, it is not necessary to adopt the high-concentration substrate that must be adopted in the prior art. If the concentration of the N-type semiconductor substrate 1 is set as 1/10-10 times the concentration of the N-type top epitaxial sub-layer 203 corresponding to the first layer of N-type sub-pillars 203, then the interdiffusion effect between the epitaxies of the N-type semiconductor substrate 1 on the N-type top epitaxial sub-layers 203 and 204 can be ignored. In production, setting the concentration of the N-type semiconductor substrate 1 to the same order of magnitude of the concentration of the N-type top epitaxial sub-layer 203 can be realized without increasing additional cost, which can well solve the following problems of the existing high-concentration substrate:

outdiffusion caused by the high-concentration substrate has difference influences on the device in the edge/center region of the wafer;

the high-concentration substrate needs to control mix-run in the production process;

back encapsulation is required before depositing a relatively-low-concentration epitaxy on the high-concentration substrate.

At the same time, it brings about the following additional beneficial effects:

through back ion implantation, a thin high-concentration N+ region, i.e., drain region 211, is formed, thus reducing the implantation effect of back N+ of the body diode, reducing Irrm and improving softness;

since the N+ concentration of the substrate is reduced, an appropriate amount of P-type impurities can be implanted into the back region to form part of the P-type region, thus further improving the characteristics of the body diode, including Irrs, especially the softness of reverse recovery.

The device structure according to this embodiment of the present application will be further described in detail in combination with specific parameters:

In this embodiment of the present application, the gate oxide layer 8 (Gox) adopts 700 Å.

The concentration of N-type semiconductor substrate 1, that is, the corresponding N-type resistivity is 0.08-8 Ω·cm.

The N-type resistivity of the epitaxial layers 202, 203 and 204 is 0.8 Ω·cm. Here, different epitaxial layers are directly distinguished by reference signs.

The top width of the two layers of trenches is 3 μm, and the top width of the N-type pillars is 2 μm. The inclination angle of the trenches is 88.8°.

The depth of the first layer of P-type sub-pillars 301 is 30 μm, and the depth of the second layer of P-type sub-pillars 302 is 20 μm.

The thickness of the epitaxial layer 202 is 10 μm.

The initial thickness of the epitaxial layer 201 is 20 μm, and the resistivity is 0.08 Ω·cm.

After thinning, phosphorus ion implantation and annealing are performed, and the implantation dose is such determined that the phosphorus concentration on the back surface is 1E19 $cm^{-3}$.

It is estimated that the influence of the epitaxial layers 203 and 204 on the on resistance is 0.8*L (50 μm)/W (2 μm)=0.8*25.

The influence of the epitaxial layer 202 on the on resistance is 0.8*L (10 μm)/W (5 μm)=0.8*2.

The sum of the above two values is about 0.8*27.

The thickness of the epitaxial layer 201 after being thinned is 10 μm, and its contribution is 0.08*2, which is 1/135 of the former.

The thickness of the epitaxial layer 201 after being thinned is 5 μm, and its contribution is 0.08*1, which is 1/270 of the former.

In the above two cases, the contribution difference of the epitaxial layer 201 may be ignored. Therefore, the epitaxial layer 201 has a good redundancy effect.

Considering the back phosphorus ion implantation, the difference of the contribution of the epitaxial layer 201 with different thickness to the on resistance will be further reduced, so the actual difference is smaller.

This embodiment of the present application specially configures the impurity concentration relationship between the N-type semiconductor substrate 1 and the top epitaxial layer corresponding to the super junction structure. Such configuration can ensure that the N-type semiconductor substrate 1 will not form the impurity outdiffusion that will influence the doping distribution of the super junction structure. Therefore, the present application can eliminate the adverse effect of the impurity outdiffusion of the high-concentration substrate on the super junction structure, making the super junction structure capable of realizing an ultra-low specific-on-resistance structure, for example, making the pitch of the P-N pillars of the super junction structure smaller and the depth greater, thus reducing the specific on resistance of the device.

Since this embodiment of the present application does not reduce the specific on resistance of the device by increasing the doping concentration of the N-type semiconductor substrate 1, the N-type semiconductor substrate 1 will be completely removed in the back thinning process to eliminate the adverse effect of the N-type semiconductor substrate 1 on the specific on resistance of the device.

In order to completely remove the N-type semiconductor substrate 1 without influencing the N-type buffer layer 202, an N-type redundant epitaxial layer 201 is additionally disposed in this embodiment of the present application. The N-type redundant epitaxial layer 201 can increase the process window of the back thinning process, so that the N-type semiconductor substrate 1 can be completely removed without influencing the N-type buffer layer 202.

This embodiment of the present application further configures the doping concentration relationships between the N-type redundant epitaxial layer 201 and the N-type semiconductor substrate 1, and between the N-type redundant epitaxial layer 201 and the N-type buffer layer 202, that is, it can avoid the adverse effect caused by the excessive doping concentration of the N-type redundant epitaxial layer 201, for example, the fluctuation in the resistivity of the epitaxial layer in a transition region. At the same time, it can also form a drain region 211 with high doping concentration in combination with back N-type ion implantation, form a good ohmic contact with the back metal layer, reduce the ratio of back contact resistance to the whole on resistance to less than 1%.

Referring to FIG. 1 to FIG. 8, they illustrate schematic diagrams of device structures in steps of a method for manufacturing a super junction device according to an embodiment of the present application. The method for manufacturing the super junction device according to this embodiment of the present application includes the following steps:

In step 1, referring to FIG. 2, an N-type redundant epitaxial layer 201 and an N-type buffer layer 202 are sequentially formed on an N-type semiconductor substrate 1.

The resistivity of the N-type semiconductor substrate 1 is 0.1-10 times the resistivity of a subsequent top epitaxial layer to ensure that the outdiffusion of doped impurities in the N-type semiconductor substrate 1 does not influence the performance of the super junction structure.

The resistivity of the N-type redundant epitaxial layer 201 is 0.1-10 times the resistivity of the N-type semiconductor substrate 1, and the resistivity of the N-type redundant epitaxial layer 201 is lower than the resistivity of the N-type buffer layer 202.

In the method according to this embodiment of the present application, the N-type semiconductor substrate 1 with a large variation range of resistivity, relatively high resistivity, i.e., low concentration, is adopted. The resistivity of the substrate, i.e., the resistivity of the N-type semiconductor substrate 1, is set as $\frac{1}{10}$-10 times the N-type epitaxial resistivity of the P-N pillars, i.e., the super junction structure, i.e., the epitaxial layers 203 and 204 in the subsequent top epitaxial layer. For example, the N-type epitaxial layers 203 and 204 of the P-N pillars adopt 0.8 Ω·cm; the N-type semiconductor substrate 1 adopts 0.08-8 Ω·cm, and the variation ranges may be many, that is, the resistivity of different thicknesses and regions of the semiconductor substrate 1 may be different, so it is easy to manufacture. The resistivity of the substrate is set within 0.1-10 times the resistivity of the N-type epitaxial layers 203 and 204 of the P-N pillars directly deposited thereon. The difference between the resistivity of the substrate and the resistivity of other epitaxial layers 201 and 202 on the substrate 1 is required to not exceed one order of magnitude. In this way, it is ensured that the outdiffusion of impurities in the high-concentration substrate will not influence the device performance in the working process of the device, and it will not increase the difficulty of the fluctuation process of resistivity in the transition region during deposition of the epitaxial layer 201 or 202 since the impurity concentration of the epitaxial layer is much higher than the impurity concentration of the substrate.

In FIG. 1, an N-type redundant epitaxial layer 201 is deposited on the N-type semiconductor substrate 1, and the thickness of the N-type redundant epitaxial layer 201 may be 20 μm.

An N-type buffer layer 202 is deposited on the N-type redundant epitaxial layer 201.

The resistivity of the N-type redundant epitaxial layer 201 is selected to be 0.1-10 times the resistivity of the substrate. Compared with the resistivity of the epitaxial layer thereon, it is lower than the resistivity of the N-type buffer layer 202. Generally, the resistivity of the N-type redundant epitaxial layer 201 is selected to be $\frac{1}{10}$ of the resistivity of the N-type buffer layer 202. The thickness of the N-type redundant epitaxial layer 201 is set according to the control ability of the subsequent thinning process. After the thinning process is completed, the N-type redundant epitaxial layer 201 is completely removed or partially remained, but the N-type buffer layer 202 is completely remained for subsequent processes.

The resistivity of the N-type buffer layer 202 and the subsequent epitaxial layer 203 may be the same or different. For example, it is selected so that the resistivity of the N-type buffer layer 202 is 0.5-2 times the resistivity of the epitaxial layer 203.

The thickness of the N-type buffer layer 202 has a certain influence on the characteristics of the body diode and the on resistance of the device, and may be set to 0-20 μm. When there are some requirements for EAS of the device, it may generally be set to 5-20 μm.

The resistivity of the N-type redundant epitaxial layer 201 is less than 0.2 times the resistivity of the top epitaxial layer. For example, the resistivity of the N-type redundant epitaxial layer 201 is 0.1 times the resistivity of the top epitaxial layer.

In step 2, a super junction structure is formed on a surface of the N-type buffer layer 202 through a trench filling process. The super junction structure is formed by alternately arranging P-type pillars and N-type pillars, the P-type pillars consist of a P-type semiconductor layer filled in trenches, the trenches are formed in a top epitaxial layer, and the N-type pillars consist of the top epitaxial layer filled between the P-type pillars.

In the method according to this embodiment of the present application, the super junction structure is formed by superposing a plurality of layers of super junction substructures, each layer of the super junction substructures is formed by alternately arranging P-type sub-pillars and N-type sub-pillars of the corresponding layer, all layers of the P-type sub-pillars are longitudinally superposed to form the P-type pillars, and all layers of the N-type sub-pillars are longitudinally superposed to form the N-type pillars.

Description is made below by taking the number of layers of the super junction substructures in the super junction structure being two as an example. In other embodiments, the number of layers of the super junction substructures may also be three or more, so that the difficulty of the trench filling process of each layer is reduced, or the BVdss of the device is improved. A process of forming the super junction structure consisting of two layers of stack structures includes the following steps:

In step 21, epitaxial growth is performed. Referring to FIG. 1, an N-type top epitaxial sub-layer 203, which is referred to as an epitaxial layer 203 for short, is formed in the N-type buffer layer.

The bottom surface of the epitaxial layer 203 is illustrated as line A1A2 and the top surface is illustrated as line B1B2.

In step 22, trench etching is performed. A hard mask layer formed by superposing a bottom oxide film, an intermediate silicon nitride film and a top oxide film is deposited on the top surface of the epitaxial layer 203. After the hard mask layer in the region opened through photolithography is etched through photolithography and etching, silicon etching is performed to form the trenches of the first layer of the super junction substructures, i.e., a first layer of trenches, and the bottom of the first layer of trenches reaches the bottom of the epitaxial layer 203.

In step 23, trench filling is performed. Referring to FIG. 2, after etching is completed, the top oxide film and the intermediate nitride film in the hard mask layer are etched off through a dry or wet process, leaving the bottom oxide film as the hard mask of trench filled silicon. Then, referring to FIG. 3, the first trench is completely filled with a P-type semiconductor layer, such as a P-type silicon epitaxial layer. The silicon on the surface is completely removed through chemical-mechanical polishing, and then the bottom oxide film is etched off. A first layer of P-type sub-pillars 301 and a first layer of N-type sub-pillars 203 are formed. The first layer of P-type sub-pillars 301 and the first layer of N-type sub-pillars 203 are adjacent to each other to form a first P-N pillar, i.e., a first layer of super junction substructures. The charge reaches a balance or the difference in charges is less than 5% of the total amount of charges of the first layer of P-type sub-pillars 301, and is also less than 5% of the total amount of charges of the first layer of P-type sub-pillars 301.

Figure 4:
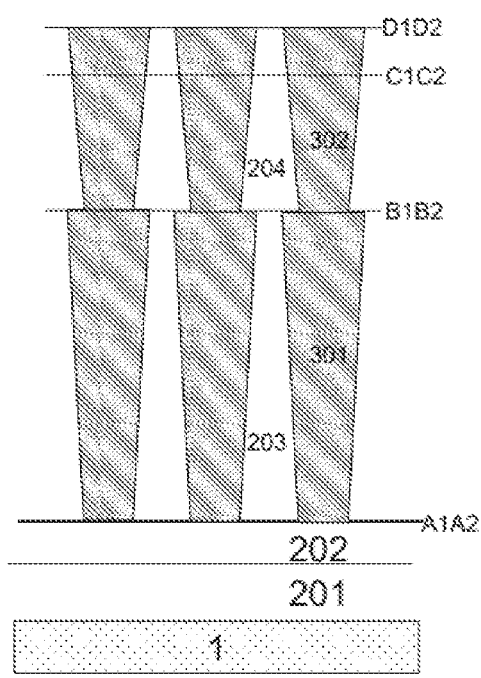

Step 21 to step 23 are repeated to form a second P-N pillar, i.e., a second layer of super junction substructures. Referring to FIG. 4, a second layer of P-type sub-pillars 302 and a second layer of N-type sub-pillars 204 are formed. The bottom of the second layer of P-type sub-pillars 302 must contact the top of the first layer of P-type sub-pillars 301 and may have a certain depth of penetration. The resistivity of the epitaxial layer corresponding to the second layer of N-type sub-pillars 204 is set to be the same as or different from the resistivity of the epitaxial layer 203. The second layer of P-type sub-pillars 302 and the second layer of N-type sub-pillars 204 are adjacent to each other to form a second P-N pillar. The charge reaches a balance or the difference in charges is less than 5% of the total amount of charges of the second layer of N-type sub-pillars 204, and is also less than 5% of the total amount of charges of the second layer of P-type sub-pillars 302.

In step 3, a front process is completed.

Figure 5:
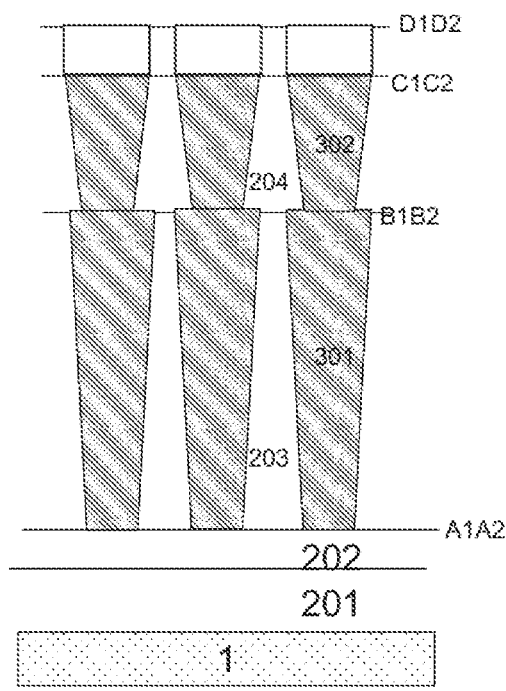

Referring to FIG. 5, a P-type well 6 is formed in the top of each P-type pillar, and the P-type well 6 also extends into the N-type pillars on the two sides. The top surface of the P-type well 6 is illustrated as line D1D2 and the bottom surface is illustrated as line C1C2. After the P-type well 6 is formed, the top surface of the second layer of super junction substructures is lowered to the position illustrated by line C1C2.

Figure 6:
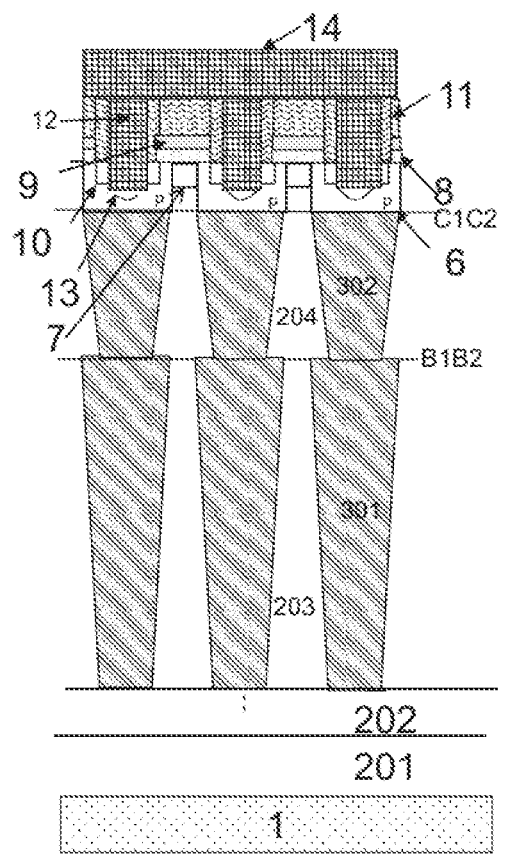

Referring to FIG. 6, a dielectric layer and polysilicon are formed and patterned to form a gate structure formed by superposing a gate dielectric layer such as a gate oxide layer 8 and a polysilicon gate 9 on the top of the P-type well 6. In FIG. 6, the gate oxide layer 8 and the polysilicon gate 9 at the tops of two adjacent P-type wells 6 on the two sides of the N-type pillar are connected together to form an integral structure.

N-type heavily doped ion implantation is performed to form a source region 10 in the surface region of the P-type wells 6 on the two sides of the polysilicon gate 9.

An interlayer film 11 is formed. The interlayer film 11 covers a region between the top of the polysilicon gate 9 and the polysilicon gate 9.

A contact opening passing through the interlayer film 11 is formed. A contact P-type implantation contact region 13 is formed at the bottom of the contact opening in the top of the source region 10.

A method is filled in the contact opening to form a contact 12.

A front metal layer 14 is formed and patterned to form a source and a gate. FIG. 6 illustrates a source formed by the front metal layer 14.

Generally, in order to further reduce the on resistance, a JFET implantation region 7 is usually formed through N-type ion implantation in the surface region of the N-type pillar between the P-type wells 6.

Then, the following back process is performed.

Figure 7:
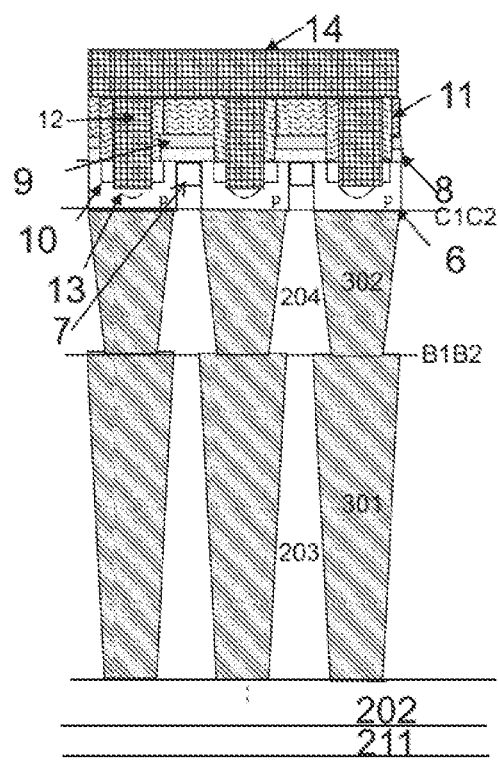

In step 31, referring to FIG. 7, a back thinning process is performed. The N-type semiconductor substrate 1 is removed in the back thinning process.

The N-type redundant epitaxial layer 201 is partially removed in the back thinning process, the remaining N-type redundant epitaxial layer is separately marked with reference sign 211, and a drain region subsequently formed in the remaining N-type redundant epitaxial layer is also marked with reference sign 211. The N-type redundant epitaxial layer 201 may also be completely removed.

The thickness of the N-type buffer layer 202 is completely remained after the back thinning process.

In the back thinning process, the N-type redundant epitaxial layer 201 is used to ensure that the back thinning process is capable of completely removing the N-type semiconductor substrate 1 without influencing the N-type buffer layer 202.

Figure 8:
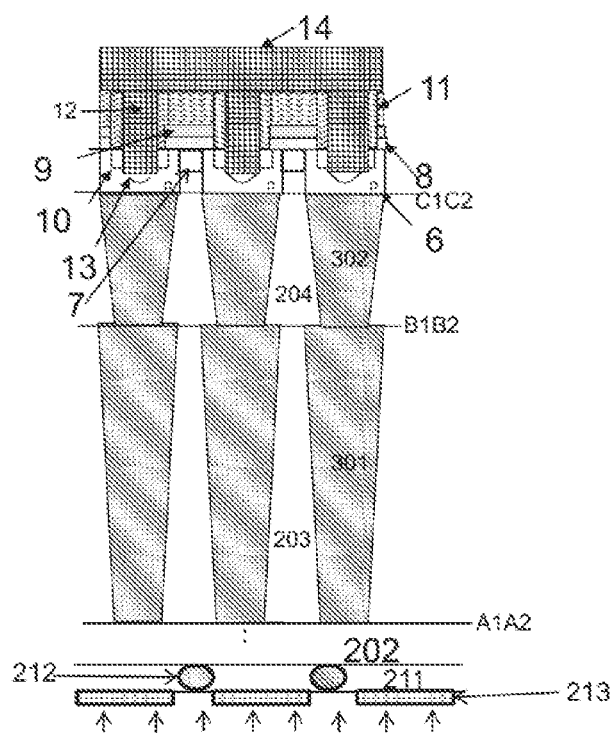

In step 32, referring to FIG. 8, a back photoresist 203 pattern opening a back P-type impurity region 212 is formed by adopting a photolithography process.

Then, back P-type ion implantation is performed to implant P-type impurities in selected regions and form the back P-type impurity region 212. The implantation peak position of the back P-type ion implantation is greater than the implantation peak position of the back N-type ion implantation; there is spacing between the back P-type impurity region 212 and bottom surfaces of the P-type pillars.

The impurity of the back P-type ion implantation includes B or BF2, the implantation dose is $1E11\ cm^{-2}$-$5E12\ cm^{-2}$, and the implantation energy is 50 keV-400 keV.

The size of at least one direction of each selected region of the back P-type impurity region 212 is greater than or equal to 5 microns; the thickness of photoresist 213 in the photolithography process is greater than or equal to 4 microns.

The back P-type impurity region 212 is of P-type net doping, and the maximum concentration of P-type net doping in the back P-type impurity region 212 is less than or equal to the minimum concentration of the P-type pillars. In some embodiments, the back P-type impurity region 212 is of P-type net doping, and the maximum concentration of P-type net doping in the back P-type impurity region 212 is less than or equal to ½ of the minimum concentration of the P-type pillars.

Alternatively, the back P-type impurity region 212 is of N-type net doping, and the concentration of N-type net doping in the back P-type impurity region 212 is ⅕-1/100 of the concentration of N-type impurities when P-type impurities are not implanted.

Figure 9:
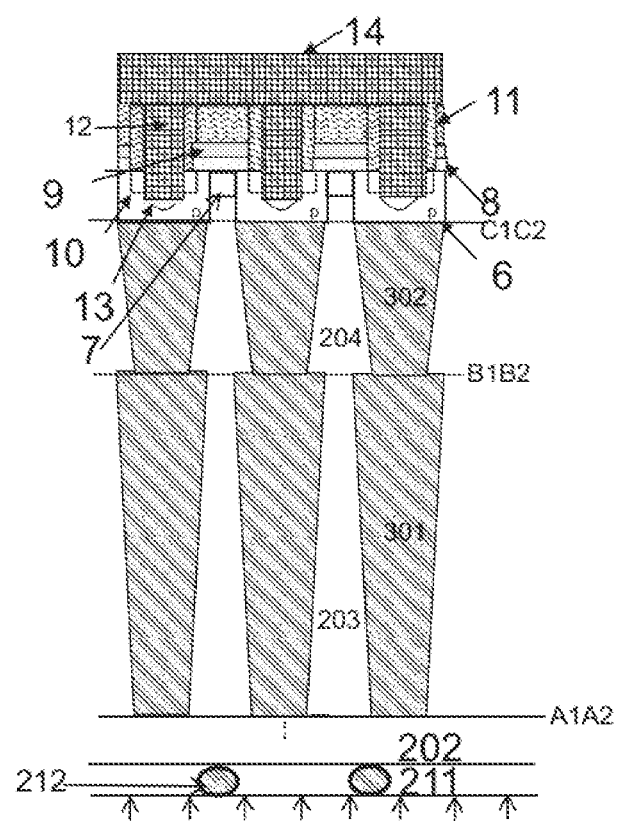

In step 33, referring to FIG. 9, back N-type ion implantation is performed to form a drain region 211. The N-type redundant epitaxial layer 201 further ensures that the drain region 211 is capable of reaching required doping concentration.

The drain region 211 and the back P-type impurity region 212 are subject to laser annealing, and the depth range of the back P-type impurity region 212 is less than or equal to the depth of the laser annealing.

The area of the back P-type impurity region 212 is 5%-30% of the area of the whole drain region 211.

The impurity of the back N-type ion implantation includes phosphorus or arsenic. It is better to set the impurity concentration of back N+ so that a very good ohmic contact with a subsequent back metal layer 15 is formed, and the proportion of the contact resistance in the on resistance of the device is less than 1%, which can be ignored, while the impurity concentration of N+ remains at a low level.

The implantation energy of the back N-type ion implantation may be set to 20-100 Kev, and it is better to set it to 30-75 Kev; the implantation dose may be set to 5E12/cm2-5E15/cm2, and it is better to set it to 5E13/cm2-1e15/cm2. Then, the implanted ions in the back region are activated through laser annealing.

Then, a back metal layer 15 is deposited on the back of the drain region 211. The back metal layer 15 may be a Ti layer, Ni layer or Ag layer. The thickness may be set to 1000 Å for Ti layer, 1000-2000 Å for Ni layer and 10000 Å for Ag layer.

In this embodiment of the present application, a patterned back P-type ion implantation step is added on the basis of the conventional back N-type ion implantation. Referring to FIG. 7, through back photolithography, P-type impurities are implanted on the back of the thinned semiconductor substrate such as silicon wafer. The P-type impurities may be B or BF2, and the energy is set to 50-4000 Kev. The energy setting needs to consider that the position of the peak concentration of P-type impurities is a certain distance, for example, more than 0.5 micron from the high-concentration region of the N+ drain region 211 on the back of the silicon wafer. The energy setting also needs to consider the effective annealing depth of subsequent laser annealing equipment. For example, if the laser annealing equipment can only effectively activate ions within a depth of 4 microns from the back surface, the implantation peak depth of P-type implantation is required to not be greater than 4 microns. Of course, after annealing, the implanted P-type impurities are required to be a little away from the bottom of the P-N pillars, i.e., the super junction structure. Otherwise, it becomes connected with the P-type pillars, which is used to increase BVdss, so that the effect of improving the softness of the body diode is reduced or disappears.

The region of back P-type implantation is set according to the influence on the on resistance. It is generally recommended to set it to 5%-30% of the whole active area. When the distance between the peak position of the region of P-type ion implantation and the peak position of the implantation region of the drain region on the back increases, its influence on the on resistance is relatively small, and the area may be increased.

The implantation dose of the back P-type impurity region 212 is required to be set so that, after balancing the original N-type impurities in the implantation region, and the remaining P-type impurity concentration is not higher than the P-type impurity concentration of the P-N pillars. Generally, it is recommended that the remaining P-type impurity concentration on the back should be less than or equal to ½ of the minimum P-type impurity concentration of the P-N pillars. Moreover, even if the implantation region fails to completely balance the N-type impurities after P-type ion implantation, as long as the N-type impurities in this region are effectively reduced, for example, to ⅕-1/100 of the original N-type impurities, the softness of the body diode will also be significantly improved. Generally, for example, the implantation dose of B may be set to a level of 1E11 $cm^{-2}$ to −5E12 cm−2.

For the setting of the region of P-type ion implantation, a large pattern may be used. For example, an opening (implantation region) with a transverse size greater than or equal to 5 microns may be used. For this back P-type photolithography, photoresist with a thickness greater than or equal to 4 microns may be used, leaving room for the selection of ion implantation energy.

The present application has been described above in detail through specific embodiments, which, however, do not constitute restrictions on the present application. Without departing from the principle of the present application, those skilled in the art may also make many variations and improvements, which should also be regarded as falling within the scope of protection of the present application.

What is claimed is:

1. A super junction device, wherein the super junction device comprises:
   an N-type redundant epitaxial layer and an N-type buffer layer located on a top surface of the N-type redundant epitaxial layer;
   a super junction structure is formed on the N-type buffer layer, the super junction structure is formed by alternately arranging P-type pillars and N-type pillars, the P-type pillars consist of a P-type semiconductor layer filled in trenches, the trenches are formed in a top epitaxial layer, and the N-type pillars consist of the top epitaxial layer filled between the P-type pillars;
   a back structure of the super junction device comprises a drain region and a patterned back P-type impurity region;
   the drain region is formed through full plane back N-type ion implantation after a back thinning process;
   the back P-type impurity region is selected through a photolithography process, and the back P-type impurity region comprises P-type impurities formed through back P-type ion implantation in selected regions;
   an implantation peak position of the back P-type ion implantation is greater than an implantation peak position of the back N-type ion implantation; there is spacing between the back P-type impurity region and bottom surfaces of the P-type pillars;
   the N-type redundant epitaxial layer is partially removed in the back thinning process, and a thickness of the N-type buffer layer is completely remained after the back thinning process; and a resistivity of the N-type redundant epitaxial layer is less than 0.2 times and more than 0.1 times a resistivity of the top epitaxial layer, and the N-type redundant epitaxial layer is used to ensure that the back thinning process does not affect the N-type buffer layer and to ensure that the drain region is capable of reaching a required doping concentration.

2. The super junction device according to claim 1, wherein a resistivity of the N-type buffer layer is 0.5-2 times the resistivity of the top epitaxial layer.

3. The super junction device according to claim 2, wherein the resistivity of the N-type buffer layer is equal to the resistivity of the top epitaxial layer.

4. The super junction device according to claim 1, wherein the resistivity of the N-type redundant epitaxial layer is 0.1 times the resistivity of the top epitaxial layer.

5. The super junction device according to claim 1, wherein an impurity of the back N-type ion implantation comprises phosphorus or arsenic, and an implantation dose is $5E12\ cm^{-2}$-$1E15\ cm^{-2}$;
an impurity of the back P-type ion implantation comprises B or BF2, the implantation dose is $1E11\ cm^{-2}$-$5E12\ cm^{-2}$, and an implantation energy is 50 keV-400 keV.

6. The super junction device according to claim 1, wherein a size of at least one direction of each selected region of the back P-type impurity region is greater than or equal to 5 microns; a thickness of photoresist in the photolithography process is greater than or equal to 4 microns.

7. The super junction device according to claim 1, wherein the back P-type impurity region is of P-type net doping, and a maximum concentration of P-type net doping in the back P-type impurity region is less than or equal to a minimum concentration of the P-type pillars.

8. The super junction device according to claim 7, wherein the back P-type impurity region is of P-type net doping, and the maximum concentration of P-type net doping in the back P-type impurity region is less than or equal to ½ of the minimum concentration of the P-type pillars.

9. The super junction device according to claim 1, wherein the back P-type impurity region is of N-type net doping, and a concentration of N-type net doping in the back P-type impurity region is ⅕-¹⁄₁₀₀ of a concentration of N-type impurities when P-type impurities are not implanted.

10. The super junction device according to claim 1, wherein the drain region and the back P-type impurity region are subject to laser annealing, and a depth range of the back P-type impurity region is less than or equal to a depth of the laser annealing.

11. The super junction device according to claim 1, wherein an area of the back P-type impurity region is 5%-30% of an area of the whole drain region.

12. The super junction device according to claim 1, wherein the super junction structure is formed by superposing a plurality of layers of super junction substructures, each layer of the super junction substructures is formed by alternately arranging P-type sub-pillars and N-type sub-pillars of a corresponding layer, all layers of the P-type sub-pillars are longitudinally superposed to form the P-type pillars, and all layers of the N-type sub-pillars are longitudinally superposed to form the N-type pillars;

a number of layers of the super junction substructures in the super junction structure is two or more than three;
an opening width of each P-type sub-pillar is equal to an opening width of the N-type sub-pillar of the same layer;
or the opening width of each P-type sub-pillar is not equal to the opening width of the N-type sub-pillar of the same layer;
a charge balance structure in each layer of the super junction substructures is configured so that a deviation of a total amount of impurities in the P-type sub-pillars and the N-type sub-pillars is less than 5% of a total amount of impurities in any one of the P-type sub-pillars and the N-type sub-pillars;
a thickness of each layer of the N-type sub-pillars above a second layer is configured so that N-type top epitaxial sub-layers corresponding to the N-type sub-pillars are capable of identifying alignment marks and overlay accuracy marks at the bottom after deposition.

13. The super junction device according to claim 12, wherein a first layer of super junction substructures is located at the bottom and a second layer of super junction substructures is superposed on the first layer of super junction substructures;
in the second layer of super junction substructures, a top opening width of a second layer of P-type sub-pillars is greater than a bottom opening width, and a best charge balance is realized at the bottom of the second layer of P-type sub-pillars between the second layer of P-type sub-pillars and a second layer of N-type sub-pillars; in the first layer of super junction substructures, a top opening width of a first layer of P-type sub-pillars is greater than a bottom opening width, and the best charge balance is realized at a top of the first layer of P-type sub-pillars between the first layer of P-type sub-pillars and a first layer of N-type sub-pillars;
or the trenches of the first layer of P-type sub-pillars of the first layer of super junction substructures are inclined trenches, and the trenches of the second layer of P-type sub-pillars of the second layer of super junction substructures are vertical trenches; a depth of the first layer of P-type sub-pillars is more than 10 microns greater than a depth of the second layer of P-type sub-pillars; in the second layer of super junction substructures, charge balance is realized at each longitudinal position between the second layer of P-type sub-pillars and the second layer of N-type sub-pillars;
or the trenches of the first layer of P-type sub-pillars of the first layer of super junction substructures are vertical trenches, and the trenches of the second layer of P-type sub-pillars of the second layer of super junction substructures are inclined trenches; the depth of the first layer of P-type sub-pillars is more than 10 microns greater than the depth of the second layer of P-type sub-pillars; in the first layer of super junction substructures, charge balance is realized at each longitudinal position between the first layer of P-type sub-pillars and the first layer of N-type sub-pillars.

* * * * *